United States Patent
Ma et al.

(10) Patent No.: US 9,879,822 B2
(45) Date of Patent: Jan. 30, 2018

(54) FIXING STRUCTURE AND DISPLAY DEVICE HAVING THE FIXING STRUCTURE

(71) Applicant: BOE TECHNOLOGY GROUP CO., LTD., Beijing (CN)

(72) Inventors: Yongda Ma, Beijing (CN); Xinyin Wu, Beijing (CN); Jian Xu, Beijing (CN); Yuxin Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/324,787

(22) PCT Filed: Feb. 19, 2016

(86) PCT No.: PCT/CN2016/074079
§ 371 (c)(1),
(2) Date: Jan. 9, 2017

(87) PCT Pub. No.: WO2017/041443
PCT Pub. Date: Mar. 16, 2017

(65) Prior Publication Data
US 2017/0198861 A1 Jul. 13, 2017

(30) Foreign Application Priority Data

Sep. 8, 2015 (CN) .................... 2015 2 0691250 U

(51) Int. Cl.
*A47F 1/14* (2006.01)
*F16M 13/02* (2006.01)
(Continued)

(52) U.S. Cl.
CPC ........... *F16M 13/022* (2013.01); *F16B 47/00* (2013.01); *H05K 5/0234* (2013.01)

(58) Field of Classification Search
USPC ........................................................ 248/467
See application file for complete search history.

(56) References Cited

U.S. PATENT DOCUMENTS 4,648,572 A * 3/1987 Sokol ...................... B60R 11/02
248/205.2
5,595,364 A * 1/1997 Protz, Jr. .................. A47G 1/17
248/205.5
(Continued)

FOREIGN PATENT DOCUMENTS

CN 202171104 U 3/2012
CN 103968215 A 8/2014
(Continued)

OTHER PUBLICATIONS

International Search Report dated May 27, 2016 issued on corresponding International Application No. PCT/CN2016/074079 along with an English translation of the Written Opinion of the International Searching Authority.

*Primary Examiner* — Monica Millner
(74) *Attorney, Agent, or Firm* — Nath, Goldberg & Meyer; Joshua B. Goldberg; Annie J. Kock

(57) ABSTRACT

Disclosed herein is a fixing structure. The fixing structure comprises a seat and at least a fixing device, the fixing device including a connecting part and a sucking disc, on end of the connecting part being connected to the seat while the other end of the connecting part being connected to the sucking disc, and the sucking disc being used to be sucked on a surface of a mounting base. There is also provided a display device having the fixing structure in the disclosure. With the fixing structure mounted on the display device, the display device can be prevented from toppling down when an external force is applied thereto, thus improving the stability of the display device. Further, the fixing structure according to the disclosure is able not to damage the surface of the mounting base and can be reused.

16 Claims, 3 Drawing Sheets

(51) Int. Cl.
  *F16B 47/00*     (2006.01)
  *H05K 5/02*     (2006.01)

(56) References Cited

U.S. PATENT DOCUMENTS

| | | | | |
|---|---|---|---|---|
| 5,893,543 A * | 4/1999 | Emery | ............... | A47K 1/09 |
| | | | | 248/205.5 |
| 6,886,792 B2 * | 5/2005 | Immerman | ............ | F16B 47/00 |
| | | | | 211/106 |
| 8,333,353 B1 * | 12/2012 | Silverman | ............ | F16M 11/041 |
| | | | | 24/331 |
| 8,474,768 B2 * | 7/2013 | Zhadanov | ............ | F16M 13/022 |
| | | | | 248/205.4 |
| 8,596,331 B2 * | 12/2013 | Larson | ............... | G09F 21/04 |
| | | | | 160/350 |
| 8,870,137 B2 * | 10/2014 | Jacobson | ............ | F16M 13/022 |
| | | | | 248/222.51 |
| 2013/0048809 A1 | 2/2013 | Jacobson | | |
| 2013/0341412 A1 * | 12/2013 | Johnson | ............... | F16B 47/00 |
| | | | | 235/492 |
| 2015/0070839 A1 * | 3/2015 | Johnson | ............... | G06F 1/1626 |
| | | | | 361/679.56 |
| 2015/0191124 A1 | 7/2015 | Du | | |
| 2015/0330437 A1 * | 11/2015 | Clouser | ............... | F16B 47/00 |
| | | | | 248/206.3 |

FOREIGN PATENT DOCUMENTS

| | | |
|---|---|---|
| CN | 204042374 U | 12/2014 |
| CN | 204580828 U | 8/2015 |

\* cited by examiner

FIXING STRUCTURE AND DISPLAY DEVICE HAVING THE FIXING STRUCTURE

This is a National Phase Application filed under 35 U.S.C. 371 as a national stage of PCT/CN2016/074079 filed on Feb. 19, 2016, an application claiming the benefit of Chinese application No. 201520691250.4 filed on Sep. 8, 2015, the content of each of which is hereby incorporated by reference in its entirety.

FIELD OF THE INVENTION

The disclosure relates to the field of display technologies, and in particular to a fixing structure for a display device and a display device having the fixing structure.

BACKGROUND OF THE INVENTION

With the development of technologies, a display device becomes more and more light and thin. As a result, the lighter and thinner the display device is, the more unstable it is. In order to improve the stability of the display device, a contact area between a seat of the display device and a supporting platform is often increased, so that the light and thin display device becomes cumbersome. Further, the seat of the display device is not fixedly placed on the supporting platform, such that the display device is inclined to topple down due to an impact from an external force.

SUMMARY OF THE INVENTION

An objective of this disclosure is to provide a fixing structure and a display device having the fixing structure, to prevent the display device from toppling down when an external force is applied thereto, thus improving the stability of the display device to be fixed.

To address above technical problems, on one hand, there is provided a fixing structure in the disclosure, comprising a seat and at least a fixing device, the fixing device including a connecting part and a sucking disc, on end of the connecting part being connected to the seat while the other end of the connecting part being connected to the sucking disc, and the sucking disc being used to be sucked on a surface of a mounting base.

Preferably, the seat is provided with a locking groove, the connecting part comprises a first connecting part in connection with the sucking disc and a second connecting part in connection with the first connecting part, each of the first connecting part and the second connecting part has a cylinder shape, and the second connecting part has a diameter larger than that of the first connecting part.

Preferably, the locking groove is provided on a bottom of the seat and formed to penetrate the seat.

Preferably, the locking groove is provided on a bottom of the seat and formed not to penetrate the seat.

Preferably, the locking groove comprises an insertion hole and a slide hole in communication with the insertion hole, and the insertion hole has a width larger than that of the slide hole, such that the second connecting part is able to pass through the insertion hole but not through the slide hole.

Preferably, the slide hole has a width slightly larger than a diameter of the first connecting part, such that the first connecting part is movable into the slide hole.

Preferably, the insertion hole has any one of circular, square or polygonal shapes.

Preferably, the insertion hole has a shape corresponding to the second connecting part.

Preferably, a receiving room in communication with the locking groove may be formed between the locking groove and a bottom side of the seat, and the receiving room has a size slightly larger than that of the sucking disc sucked on the surface of the mounting base, such that the sucking disc sucked on the surface of the mounting base is able to be accommodated within the receiving room.

Preferably, the fixing structure further comprises a blocker which is able to be detachably positioned in the locking groove and which is used to keep the fixing device within the locking groove.

On the other hand, there is also provided a display device which comprises the fixing structure as described above.

With the fixing structure mounted on the display device, the display device can be prevented from toppling down when an external force is applied thereto, thus improving the stability of the display device. Further, the fixing structure according to the disclosure is able not to damage the surface of the mounting base and can be reused.

BRIEF DESCRIPTION OF THE DRAWINGS

Accompanying drawings are provided for the further understanding of the disclosure and constituting a part of the specification. Hereinafter, these drawings are intended to explain the disclosure together with the following specific embodiments, but should not be considered as limiting of the disclosure.

In the accompanying figures, 101 is a display device body; 102 is a seat; 103 is a connecting part; 31 is a first connecting part; 32 is a second connecting part; 104 is a sucking disc; 105 is a slide locking groove; 106 is a receiving room; and 107 is a blocker.

DETAILED DESCRIPTION OF THE EMBODIMENTS

Hereinafter, specific embodiments of the disclosure will be described in detail in conjunction with the accompanying drawings. It should be understood that the specific embodiments as set forth herein are merely for the purpose of the illustration and the explanation of the disclosure but not constructed as a limitation thereof.

According to one aspect of the disclosure, there is provided a fixing structure, and especially a fixing structure for a display device. The fixing structure may comprise a seat and at least a fixing device. The fixing device may comprise a connecting part and a sucking disc. One end of the connecting part is connected to the seat, while the other end of the connecting part is connected to the sucking disc. The sucking disc is used to be sucked on a surface of a mounting base.

The fixing structure according to the disclosure is able to prevent a device to be fixed (for example, a display device) from toppling down when an external force is applied thereto, thus improving the stability of the device to be fixed. Further, compared to the fixing manner with screw, the fixing structure according to the disclosure is able not to damage the surface of the mounting base (or the supporting platform) and can be easily removed and maintained. In addition, compared to the fixing manner with adhesive tapes, the fixing structure according to the disclosure is easily cleaned and can be reused.

Figure 1:
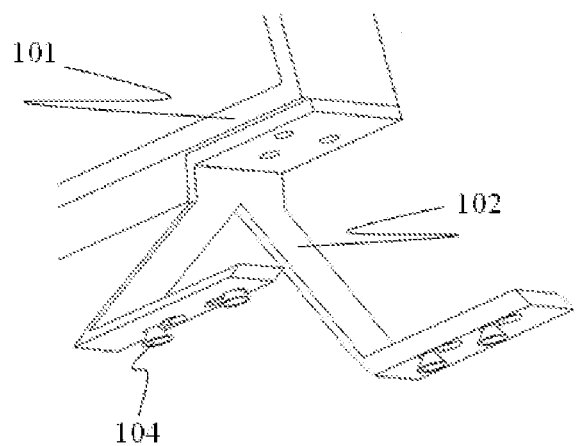
FIG. 1 illustrates a schematic diagram according to a first embodiment of the disclosure.
Figure 2A:
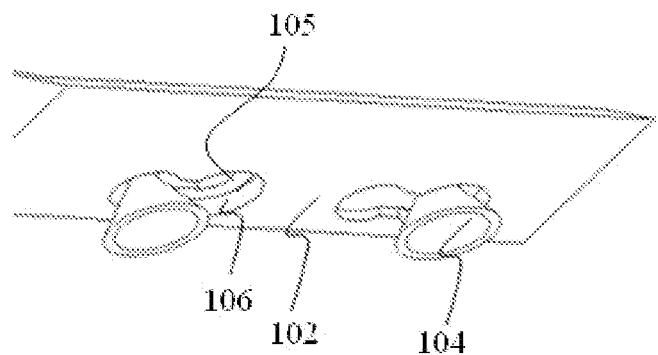
FIG. 2a illustrates another schematic diagram according to a first embodiment of the disclosure in which the locking groove is formed to penetrate the seat.
Figure 2B:
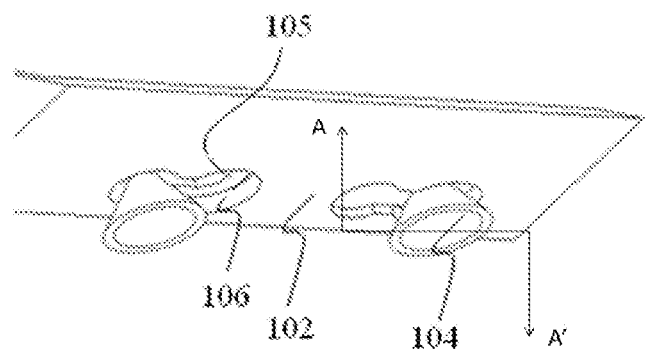
FIG. 2b illustrates another schematic diagram according to an alternative embodiment of the disclosure in which the locking groove is formed not to penetrate the seat.
Figure 3:
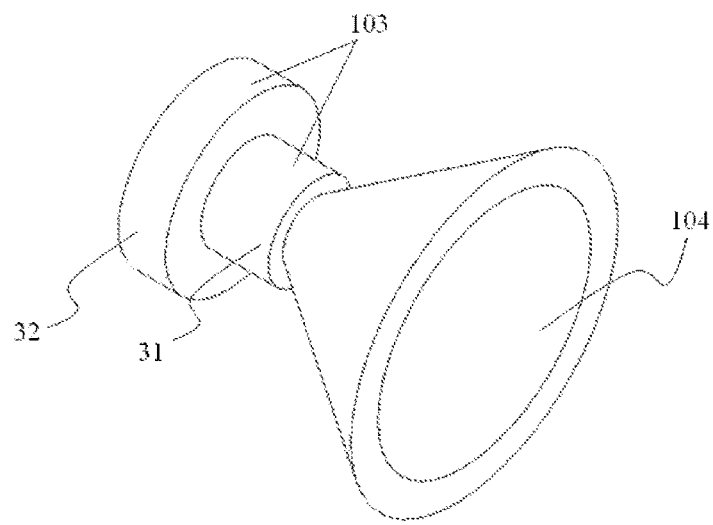
FIG. 3 illustrates a schematic diagram of a fixing device.

FIGS. 1 and 2 illustrate schematic diagrams according to a first embodiment of the disclosure. As shown, the fixing structure according to the first embodiment of the disclosure may comprise a seat 102 and at least a fixing device. The fixing device (with reference to FIG. 3) may comprise a connecting part 103 and a sucking disc 104. One end of the connecting part 103 may be locked to the seat 102 of the fixing structure. It should be appreciated that the fixing structure may include a single fixing device, or may include a plurality of fixing devices to enhance the fixing effect.

In particular, the seat 102 may be provided with a locking groove 105. The connecting part 103 may include a first connecting part 31 in connection with the sucking disc 104 and a second connecting part 32 in connection with the first connecting part 31. For the purpose of easy installation and movement (which will be described in detail hereinafter), each of the first connecting part 31 and the second connecting part 32 preferably has a cylinder shape, and the second connecting part 32 has a diameter larger than that of the first connecting part 31. Accordingly, the locking groove 105 may comprise an insertion hole and a slide hole in communication with the insertion hole. In this embodiment, the insertion hole has a width larger than that of the slide hole, such that the second connecting part 32 can pass through the insertion hole but not through the slide hole. Further, the slide hole has a width slightly larger than a diameter of the first connecting part 31, such that the first connecting part 31 is movable into the slide hole. As described above, since the second connecting part 32 could not pass through the slide hole, the connecting part 103 may be locked to the seat 102 of the fixing structure after the first connecting part 31 moves into the slide hole.

In this embodiment, the locking groove 105 is formed so as to penetrate the seat 102. In such a manner, an operator may press the second connecting part 32 from an outside of the seat 102, such that the sucking disc 104 is sucked on a supporting surface. It should be appreciated that the insertion hole may have any one of circular, square or polygonal shapes. Preferably, however, the insertion hole has a shape corresponding to the second connecting part 32.

Further, as shown in FIG. 2, a receiving room 106 in communication with the locking groove 105 may be formed between the locking groove 105 and a bottom side of the seat 102. The sucking disc 104 can be expanded once it is sucked on the surface of the mounting base. The receiving room 106 may have a size slightly larger than that of the sucking disc 104 sucked on the surface of the mounting base, such that the sucking disc 104 sucked on the surface of the mounting base can be accommodated within the receiving room 106. In such a manner, the bottom side of the seat 102 can be in contact with the supporting platform, while the sucking disc 104 can be hidden within the receiving room 106. When a display device body 101 is about to topple down in response to the external force, the sucking disc 104 can be used to stabilize the display device.

Figure 4:
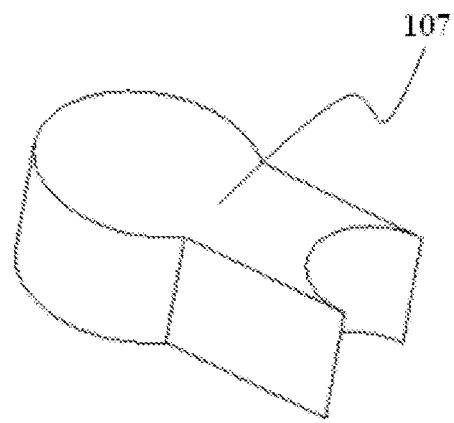
FIG. 4 illustrates a schematic diagram of a blocker used herein according to the disclosure.

Further, as shown in FIG. 4, the fixing structure according to the first embodiment of the disclosure may also comprise a blocker 107 which is able to be detachably positioned in the locking groove 105. The blocker 107 can be used to keep the fixing device within the locking groove 105, to prevent the sucking disc 104 from sliding or deflecting during the suction.

There is also provided a fixing structure according to a second embodiment in the disclosure. Like the first embodiment, the fixing structure according to the second embodiment may comprise a seat 102 and a fixing device, the fixing device may comprise a connecting part 103 and a sucking disc 104, and one end of the connecting part 103 can be locked to the seat 102.

The differences from the first embodiment are in that, in the second embodiment, the locking groove 105 if formed on a bottom of the seat 102 without penetrating the seat 102. Therefore, when ones see the seat 102 from the view of top, the connecting part 103 could not be seen so that the fixing structure can be of more aesthetic appearance. Remaining constructions of the fixing structure according to the second embodiment are the same as those in the first embodiment, the detailed description of which will be omitted accordingly.

Preferably, the fixing structure according to the second embodiment may also comprise a blocker 107 (with reference to FIG. 4) which is able to be detachably positioned in the locking groove 105. The blocker 107 can be used to fix the fixing device within the locking groove 105, to prevent the sucking disc 104 from sliding or deflecting during the suction.

Figure 5:
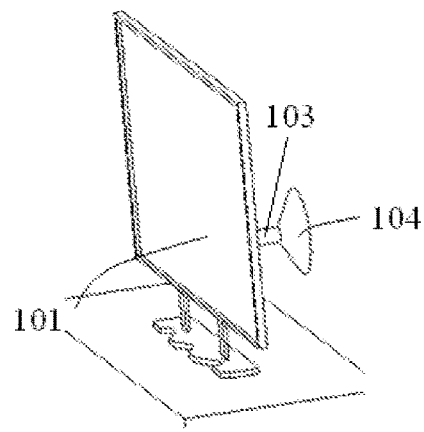
FIG. 5 illustrates a schematic diagram according to a third embodiment of the disclosure.
Figure 6:
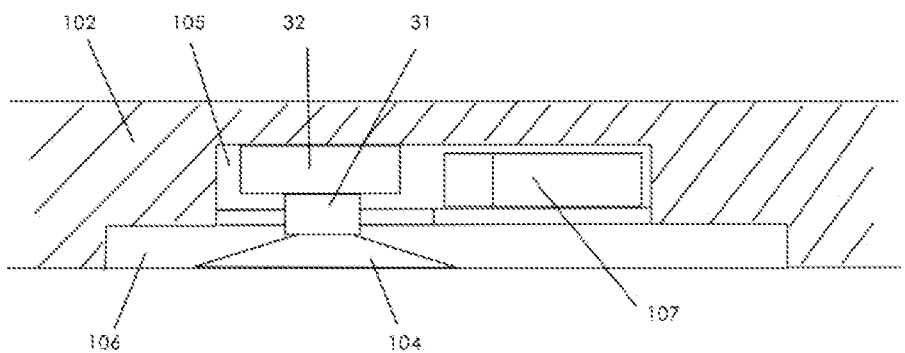
FIG. 6 is a cross-section view taken along the line A-A' in FIG. 2b showing the sucking disc that is compressed to be sucked to a surface of a mounting base.
Figure 7:
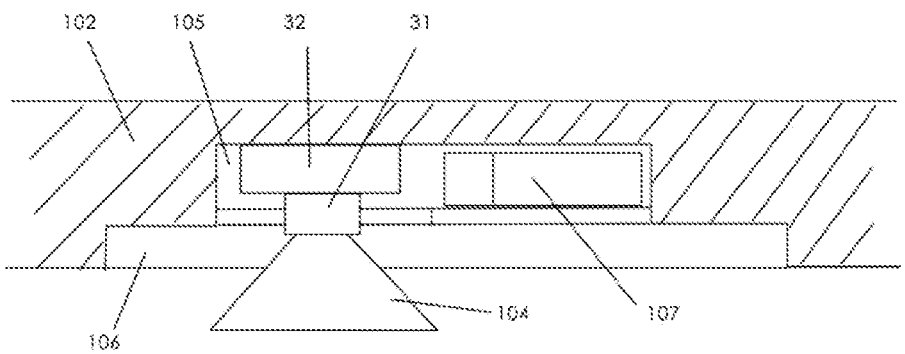
FIG. 7 is a cross-section view taken along the line A-A' in FIG. 2b showing the sucking disc that is uncompressed.

FIG. 5 illustrates a schematic diagram according to a third embodiment of the disclosure. As shown, in this embodiment, the fixing structure is positioned on a rear side of a device to be fixed (for example, a display device). The connecting part 103 of the fixing structure can be connected to a back of a display device body 101, while the sucking disc 104 of the fixing structure can be sucked to a surface of a mounting base on a rear side of the display device. In this embodiment, the connecting part 103 can be connected to the back of the display device body 101 through a seat (not shown) similar to those in the first and second embodiments, thereby improving the stability of the display device.

In addition, the display device in the disclosure may be, for example, a liquid crystal display having a relatively light self-weight. Of course, it is readily conceived by those skilled in the art that the fixing structure according to the first to the third embodiment of the disclosure can be also used with any other suitable device in addition to the display device.

In addition, the fixing structure according to the first to the third embodiments of the disclosure can be fixed to a device to be fixed (for example, a display device) through any suitable ways.

In conclusion, the fixing structure in the disclosure can be in connection with the surface of the mounting base (or the supporting platform), to prevent the device to be fixed (for example, the display device) from toppling down when an external force is applied thereto, thus improving the stability of the device to be fixed. Further, the fixing structure according to the disclosure is able not to damage the surface of the mounting base (or the supporting platform) and can be reused.

According to another aspect of the disclosure, there is also provided a display device using the fixing structure according to the first to the third embodiments as described above.

Since the display device in the disclosure include the fixing structure according to the first to the third embodiments as described above, the display device can be prevented from toppling down when an external force is applied thereto, thus improving the stability of the display device. Further, the display device in the disclosure is able not to damage the surface of the mounting base (or the supporting platform).

It should be understood that the above implementations are merely exemplary embodiments provided for the purpose of illustrating the principle of the disclosure, and the disclosure is not limited thereto. Various modifications and improvements can be made by a person having ordinary skill in the art without departing from the spirit and essence of the disclosure. Accordingly, all of the modifications and improvements also fall into the protection scope of the disclosure.

The invention claimed is:

1. A fixing structure,
comprising a seat and at least a fixing device, the fixing device including a connecting part having two ends and a sucking disc, one end of the connecting part being connected to the seat while the other end of the connecting part being connected to the sucking disc, and the sucking disc being used to be sucked on a surface of a mounting base, wherein
the seat is provided with a locking groove, the connecting part comprises a first connecting part in connection with the sucking disc and a second connecting part in connection with the first connecting part, each of the first connecting part and the second connecting part has a cylinder shape, and the second connecting part has a diameter larger than that of the first connecting part, and wherein
a receiving room in communication with the locking groove is formed between the locking groove and a bottom side of the seat, and the receiving room has a size slightly larger than that of the sucking disc sucked on the surface of the mounting base, such that the sucking disc sucked on the surface of the mounting base is able to be accommodated within the receiving room.

2. The fixing structure according to claim 1, wherein the locking groove is provided on a bottom of the seat and formed to penetrate the seat.

3. The fixing structure according to claim 1, wherein the locking groove is provided on a bottom of the seat and formed not to penetrate the seat.

4. The fixing structure according to claim 1, wherein the locking groove comprises an insertion hole and a slide hole in communication with the insertion hole, and the insertion hole has a width larger than that of the slide hole, such that the second connecting part is able to pass through the insertion hole but not through the slide hole.

5. The fixing structure according to claim 4, wherein the slide hole has a width slightly larger than a diameter of the first connecting part, such that the first connecting part is movable into the slide hole.

6. The fixing structure according to claim 5, wherein the insertion hole has any one of circular, square or polygonal shapes.

7. The fixing structure according to claim 6, wherein the insertion hole has a shape corresponding to the second connecting part.

8. The fixing structure according to claim 1, further comprising a blocker which is able to be detachably positioned in the locking groove and which is used to keep the fixing device within the locking groove.

9. A display device comprising a fixing structure in which the fixing structure has a seat and at least a fixing device, the fixing device including a connecting part having two ends and a sucking disc, one end of the connecting part being connected to the seat while the other end of the connecting part being connected to the sucking disc, and the sucking disc being used to be sucked on a surface of a mounting base, wherein
the seat is provided with a locking groove, the connecting part comprises a first connecting part in connection with the sucking disc and a second connecting part in connection with the first connecting part, each of the first connecting part and the second connecting part has a cylinder shape, and the second connecting part has a diameter larger than that of the first connecting part, and wherein
a receiving room in communication with the locking groove is formed between the locking groove and a bottom side of the seat, and the receiving room has a size slightly larger than that of the sucking disc sucked on the surface of the mounting base, such that the sucking disc sucked on the surface of the mounting base is able to be accommodated within the receiving room.

10. The display device according to claim 9, wherein the locking groove is provided on a bottom of the seat and formed to penetrate the seat.

11. The display device according to claim 9, wherein the locking groove is provided on a bottom of the seat and formed not to penetrate the seat.

12. The display device according to claim 9, wherein the locking groove comprises an insertion hole and a slide hole in communication with the insertion hole, and the insertion hole has a width larger than that of the slide hole, such that the second connecting part is able to pass through the insertion hole but not through the slide hole.

13. The display device according to claim 12, wherein the slide hole has a width slightly larger than a diameter of the first connecting part, such that the first connecting part is movable into the slide hole.

14. The display device according to claim 13, wherein the insertion hole has any one of circular, square or polygonal shapes.

15. The display device according to claim 14, wherein the insertion hole has a shape corresponding to the second connecting part.

16. The display device according to claim 9, further comprising a blocker which is able to be detachably positioned in the locking groove and which is used to keep the fixing device within the locking groove.

* * * * *